United States Patent [19]
Kahen et al.

[11] Patent Number: 5,307,361
[45] Date of Patent: Apr. 26, 1994

[54] RIDGE WAVEGUIDE LASER DIODE WITH A DEPRESSED-INDEX CLADDING LAYER

[75] Inventors: Keith B. Kahen, Rochester; Lingadahalli G. Shantharama, Penfield; David L. Peterson, Pittsford, all of N.Y.

[73] Assignee: Eastman Kodak Company, Rochester, N.Y.

[21] Appl. No.: 971,647

[22] Filed: Nov. 5, 1992

[51] Int. Cl.⁵ .............................................. H01S 3/19
[52] U.S. Cl. ........................................ 372/48; 372/45; 372/44; 372/50
[58] Field of Search .................... 372/7, 43, 44, 45, 46, 372/48, 50; 385/129, 130, 131, 132

[56] References Cited

U.S. PATENT DOCUMENTS

| | | | |
|---|---|---|---|
| 4,185,256 | 1/1980 | Scifres et al. | 385/130 X |
| 4,328,469 | 5/1982 | Scifres et al. | 372/48 X |
| 4,840,446 | 6/1989 | Nakamura et al. | 385/132 X |
| 5,010,375 | 4/1991 | Seiwa | 372/43 X |
| 5,010,376 | 4/1991 | Nishimura et al. | 372/43 X |
| 5,103,270 | 4/1992 | Sato et al. | 372/43 X |
| 5,109,464 | 4/1992 | Munowitz et al. | 385/132 X |
| 5,165,105 | 11/1992 | Haase et al. | 385/131 X |
| 5,175,740 | 12/1992 | Elman et al. | 372/45 |
| 5,210,767 | 5/1993 | Arimoto et al. | 372/45 X |
| 5,212,759 | 5/1993 | Brazas, Jr. et al. | 385/130 |

OTHER PUBLICATIONS

Yuri et al., "Reduction of Beam Divergence Angles Perpendicular to the Junction Planes by Modulating the Refractive Index Profile in AlGaAs Laser Diodes", Japanese Society of Applied Physics, Fall 1991 Meeting.

Cockerill et al., "Depressed Index Cladding Graded Barrier Separate Confinement Single Quantum Well Heterostructure Laser", Applied Physics Letter, vol. 59, 2694, 1991.

Primary Examiner—Brian Healy
Attorney, Agent, or Firm—Raymond L. Owens

[57] ABSTRACT

A depressed-index cladding ridge waveguide semiconductor laser diode includes a depressed-index cladding layer formed in the lower cladding region.

7 Claims, 4 Drawing Sheets

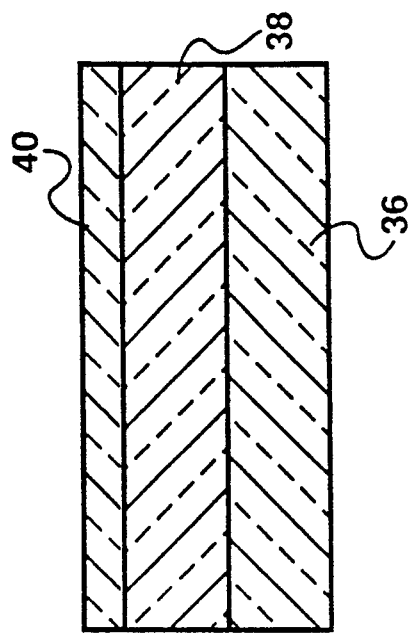
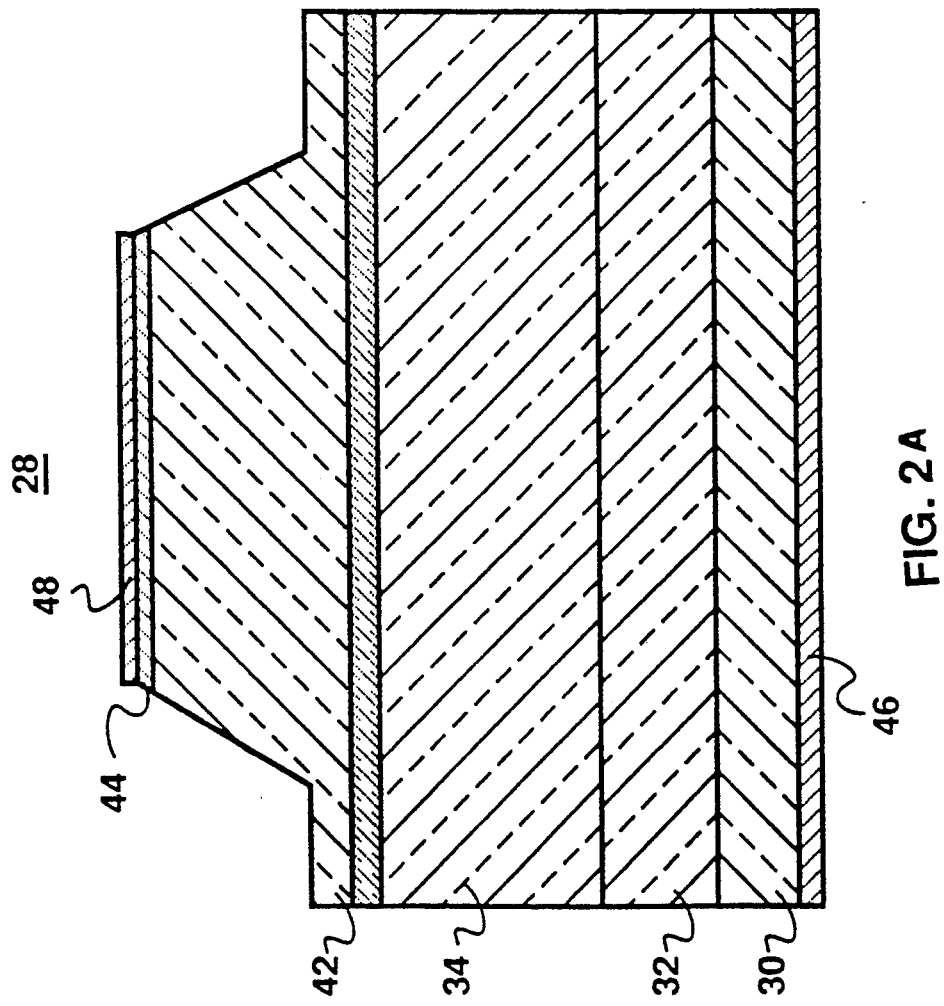

RIDGE WAVEGUIDE LASER DIODE WITH A DEPRESSED-INDEX CLADDING LAYER

CROSS-REFERENCE TO RELATED APPLICATIONS

Reference is made to commonly assigned U.S. Pat. application Ser. No. 7/971,621, filed Nov. 5, 1992, entitled "A Depressed-Index Ridge Waveguide Laser Diode Containing a Stabilizing Region" by Kahen, U.S. Pat. application Ser. No. 07/971,648, filed Nov. 5, 1992 entitled "A Ridge Waveguide Distributed-Feedback Laser Diode With a Depressed-Index Cladding Layer" by K. B. Kahen, pending the teachings of which are incorporated herein by reference.

BACKGROUND OF THE INVENTION

Typically, designs for index-guided semiconductor laser diodes are based mainly on lowering the laser's threshold current density (for optical computing applications). In order to reduce the volume of active material, the standard approach is to employ a quantum-well active region, resulting in the transparency condition being met for smaller currents. However, as the thickness of the active layer is reduced, the overlap, $\Gamma$, of the optical field with the active region also decreases, resulting in an increase in the threshold current for very small active layer thicknesses. To alleviate this problem, single quantum-wells are typically enclosed within a separate-confinement heterostructure (SCH) region so as to increase $\Gamma$ to $\sim 0.03$ and $\theta_t$ (the far-field beam divergence in the plane perpendicular to the laser junction) to $\sim 35°$.

For optical recording applications a desired feature is the quality of the output beam as typified by the far-field divergence ratio, $\rho = \theta_t/\theta_1$, where $\theta_1$ is the beam divergence in the plane parallel to the laser junction. Since the optimum value for $\rho$ is 1.0, for large $\rho$ values (i.e., $>3.0$), complex optics systems must be utilized between the laser diode and the recording media to correct the shape of the laser's output beam. Consequently, taking $\rho$ to be 2.8 and assuming the above $\theta_t$ value of 35°, $\theta_1$ must be 12.5°. For the lateral beam divergence to be this size requires either a large lateral index step and/or a small lateral waveguiding thickness (e.g., the thickness of the rib in a ridge waveguide laser diode). By employing a buried heterostructure laser diode scheme both of these criteria can be easily met, however at the expense of ease of fabrication. On the other hand, the ridge waveguide laser diode is relatively simple to manufacture, but $\theta_1$ is typically limited to values less than 10°.

Recently (M. Yuri, A. Noma, I. Ohta, and M. Kazumura, 'Reduction of beam divergence angles perpendicular to the junction planes by modulating the refractive index profile in AlGaAs laser diodes', presented at the Fall 1991 meeting of the Japanese Society of Applied Physics), a buried ridge waveguide laser diode was designed with a small transverse divergence ($\theta_t$ was $\sim 14°$), thus, easing the restriction on the magnitude of $\theta_1$. Their solution was to grow depressed-index cladding layers on both sides of the active region, as shown schematically in FIG. 1 for an AlGaAs-based laser diode. In the figure is indicated the relative Al content of the various layers, where 10 refers to the n+-GaAs substrate. On the surface of 10 is formed the lower cladding layer 12. Upon 12 is deposited the lower depressed-index cladding layer 14. The index of refraction of this layer is smaller than that of the surrounding layers since the index of refraction of AlGaAs materials is smallest for pure AlAs. On the surface of 14 is tonned the lower spacer layer 16, followed by the active region 18 and the upper spacer layer 20. Upon 20 is tonned the upper depressed-index cladding layer 22 followed by the upper cladding layer 24. Lastly, upon the surface of 24 is formed the capping layer 26. Since light tends to avoid low-index regions, the physical effect of the inclusion of the depressed-index cladding layers is to push the transverse-confined waveguide mode both toward the middle and ends of the structure. With greater light intensity present in the upper and lower cladding layers, $\theta_t$ decreases as desired. $\Gamma$ remains approximately stationary since light is also pushed towards the middle (active layer) of the structure. More specifically, it was recently (T. Cockerill, J. Honig, T. DeTemple, and J. Coleman, 'Depressed index cladding graded barrier separate confinement single quantum well heterostructure laser,' Appl. Phys. Lett., vol. 59, 2694, 1991) determined that for a broad-area graded index separate-confinement heterostructure (GRINSCH) device, $\theta_t$ was 27° and 59° for structures with and without the inclusion of the depressed-index cladding layers, respectively.

The device structure of Yuri et al. has the desirable trait of a small universe beam divergence; however, the buried ridge structure is difficult to manufacture. Thus, it would be advantageous to employ the depressed-index cladding layers in a ridge waveguide laser diode. Unfortunately, incorporating the layers into a ridge waveguide design is not straightforward. One difficulty is that in order to get sufficient interaction of the modal-field with the rib structure,, the rib etching must extend deep within the upper cladding layer, i.e., terminate just short of the upper depressed-index cladding layer. Hence, there must be tight control on the etching process: underetching will produce weak lateral confinement, while overetching into the upper depressed-index cladding layer will result in destabilizing the lasing mode. Another problem results from the modal-field having enhanced tails as discussed above. In order to avoid absorption losses in the capping layer, it is necessary to increase the thickness of the upper cladding layer to $\sim 2.4$ $\mu$m for the structure indicated in FIG. 1, which, together with the deep rib etch, results in rib heights on the order of 2.5 $\mu$m. Using conventional wet chemical etching techniques, large rib heights are difficult to produce, especially if one desires rib widths on the order of 3.0 $\mu$m.

SUMMARY OF THE INVENTION

An object of this invention is to provide an improved depressed-index cladding ridge waveguide laser diode.

This object is achieved in a depressed-index cladding ridge waveguide semiconductor laser diode comprising:

(a) a semiconductor substrate of a first conductivity type;

(b) a lower cladding layer of such first conductivity type deposited on the semiconductor substrate;

(c) a depressed-index cladding layer of such first conductivity type formed on the lower cladding layer;

(d) a spacer layer of such first conductivity type deposited on the depressed-index cladding layer;

(e) a semiconductor active layer tonned on the spacer layer;

(f) an upper cladding layer of a second conductivity type deposited on the semiconductor active layer;

(g) a capping layer of such second conductivity type formed on the upper cladding layer;

(h) a jib structure etched into the capping and upper cladding layers so as to provide lateral guiding; and (i) electrically conductive layers formed on the substrate and capping layers.

The prior difficulties inherent in designing a depressed-index cladding ridge waveguide laser diode have been overcome by employing a single depressed-index cladding layer, particularly located with respect to the active layer. As a result, the interaction of the modal-field with the rib structure is enhanced, cap absorption is lowered, and the rib height can be reduced. In order to avoid the related problem of large substrate absorption losses, a depressed-index buffer layer was grown prior to the deposition of the lower cladding layer. Since light decays rapidly inside low index layers, the resulting modal intensity is negligible inside of the substrate region, minimizing the substrate absorption loss.

Overall, a structure in accordance with this invention is simple to manufacture, has reasonable threshold current densities, and has the desired beam divergence specifications (with $\rho$ as low as 1.25).

BRIEF DESCRIPTION OF THE DRAWINGS

FIG. 2a shows in cross-section a depressed-index cladding ridge waveguide semiconductor laser diode in accordance with the invention and FIG. 2b shows an exploded portion of the laser diode in FIG. ;

DETAILED DESCRIPTION OF THE PREFERRED EMBODIMENTS

Figure 1:
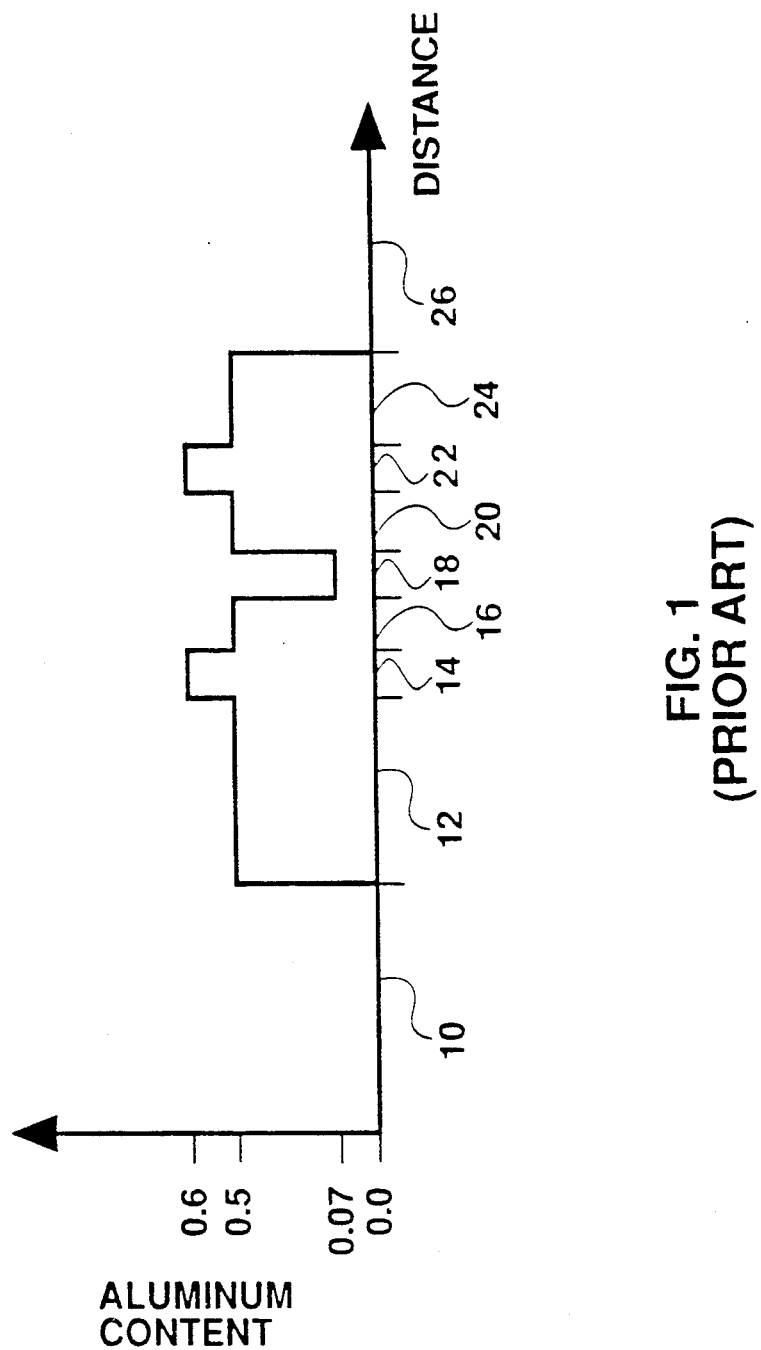
FIG. 1 shows a graph of Al content versus distance of a prior art structure.

According to a preferred embodiment, a depressed-index cladding ridge waveguide (DIC-RW) laser diode is constructed by incorporating a depressed-index layer inside of the lower cladding layer, resulting in a decrease in the far-field divergence ratio for the DIC-RW laser diode.

In accordance with this invention, FIG. 2 shows a DIC-RW laser diode 28 in which a substrate 30 is highly doped n+-GaAs. In general, the substrate does not need to be composed of n+-GaAs. It can be composed of any highly conductive semiconductive material as long as the remaining layers can be grown epitaxially upon it. The remaining sections of the DIC-RW laser diode are comprised of a series of individual semiconductive layers of predetermined thicknesses and doping types, arranged epitaxially on the substrate 30, with ohmic metal contacts 46 and 48 located at the bottom and top of the DIC-RW laser diode 28, respectively. Finally, the longitudinal length of the DIC-RW laser diode is typically from 200 to 600 $\mu$m, and in the preferred embodiment, 500 $\mu$m.

Upon the n+-GaAs substrate 30 is grown a depressed-index buffer layer 32, having a nominal thickness of 1.0 $\mu$m. In the preferred embodiment the depressed-index buffer layer is comprised of n-type $Al_{0.45}Ga_{0.55}As$, although AlGaAs of other compositions and dopant types are possible. In addition, the depressed-index buffer layer can be comprised of materials from other semiconductive systems as long as they grow epitaxially on the substrate and its refractive index is smaller than that of the lower cladding layer. The depressed-index buffer layer 32 is doped n-type with materials, such as, Si or Sn, to a concentration from $10^{17}$ to $10^{19}$ atoms/cm$^3$, with a preferred density of $5 \times 10^{17}$ atoms/cm$^3$. The preferred method of deposition is Molecular Beam Epitaxy (MBE) or Metal Organic Chemical Vapor Deposition (MOCVD); but, as is practiced in the art, many other methods of deposition, (e.g., Chemical Beam Epitaxy, Liquid Phase Epitaxy, or Atomic Layer Epitaxy) which accomplish epitaxial layers of controlled thicknesses and dopings, may be equally employed.

Upon the depressed-index buffer layer 32 is grown a lower cladding layer 34, having a nominal thickness of 2.0 $\mu$m. In the preferred embodiment the lower cladding layer is comprised of n-type $Al_{0.40}Ga_{0.60}As$, doped to a density of $5 \times 10^{17}$ atoms/cm$^3$. Other compositions and material systems are possible as long as the layer can be grown epitaxially.

Referring now to FIG. 2b, on the surface of layer 34 is formed a lower depressed-index cladding layer 36. For the preferred embodiment its composition is n-$Al_{0.65}Ga_{0.35}As$, having a thickness of 0.09 $\mu$m and a doping density of $5 \times 10^{17}$ atoms/cm$^3$. Other compositions and material systems are possible as long as the layer can be grown epitaxially and its refractive index is at least 5% smaller than that of the lower cladding layer. The amount of reduction in the transverse far-field divergence is mainly determined by the thickness and refractive index of the lower depressed-index cladding layer and also its position relative to that of the active layer. Hence, the preferred embodiment results in one value for $\theta_t$, while other possibilities are attainable by suitably adjusting the above three parameters. The relative position of the lower depressed-index cladding layer is determined by the thickness of a spacer layer 38, which is formed on the layer 36. In the preferred embodiment its composition is n-$Al_{0.40}Ga_{0.60}As$, having a thickness of 0.12 $\mu$m and a doping density of $5 \times 10^{17}$ atoms/cm$^3$. It is desirable to have its composition and doping the same as that of the lower cladding layer.

In an active layer 40 (formed on layer 38) light is produced as a result of the recombination of electrons and holes injected from the lower (spacer layer) and upper cladding layers, respectively. Typically, the active layer 40 is composed of GaAs, having thicknesses ranging from 100 to 2000 Å. In the preferred embodiment the active layer is composed of $Al_{0.12}Ga_{0.88}As$, having a thickness of 0.05 $\mu$m. The composition is chosen for applications in optical recording, where a wavelength of 785 nm is preferable. However, in general, the active layer can be formed of other AlGaAs compositions or semiconductive materials, such as InGaAs, whose band gap is chosen to be smaller than that of the materials in the surrounding layers. In order to obtain a reasonable confinement factor, $\Gamma$, small active layer thicknesses (single quantum well) are impractical, resulting in choosing a bulk thickness of 500 Å. Instead of a single bulk layer, another possibility is comprising the active layer of multiple quantum wells, as is commonly practiced in the art. The preferred method of growth of the active layer is also MBE or MOCVD, but other methods which achieve epitaxial materials of high crystallographic quality would also be acceptable. The doping of the active layer lies typically in the range from 0 to $10^{17}$ dopant atoms/cm$^3$, preferably on the order of $10^{16}$ atoms/cm$^3$; and may be of either dopant type, preferably n-type.

On the surface of layer 40 is tonned an upper cladding layer 42. For the preferred embodiment its composition is p-Al$_{0.40}$Ga$_{0.60}$As, having a thickness of 1.75 μm. Other compositions and material systems are possible as long as the layer can be grown epitaxially. The upper cladding layer is doped p-type with materials, such as, C, Be, or Zn, to a concentration from $10^{17}$ to $10^{19}$ atoms/cm$^3$, with a preferred density of $2\times10^{17}$ atoms/cm$^3$. On layer 42 is formed a P-GaAs capping layer 44, which is typically 0.1 to 0.3 μm and preferably is 0.2 μm. Its doping density is on the order of $10^{19}$ atoms/cm$^3$, preferably $5\times10^{19}$ atoms/cm$^3$. To provide electrical contact to the DIC-RW laser diode, ohmic metals 46 and 48, such as Pd-AuGe-Ag-Au and Ti-Pt-Au, respectively, are formed on the substrate and capping layers, respectively. It should be noted that the capping layer can also be n-type, if a Zn diffusion is employed to provide electrical contact from the ohmic metal 48 to the upper cladding layer, 42.

In general, semiconductor laser diodes operate effectively by confining the electron-hole and light-intensity distributions to the active layer. In addition to confinement in this, transverse, direction, confinement of both distributions in the perpendicular, lateral, direction is also preferred. In the preferred embodiment of FIG. 2, this is obtained by forming a ridge waveguide structure in the capping and upper cladding layers. As is well known to one practiced in the art, this requires etching a mesa in the capping layer 44 and upper cladding layer 42, following their deposition and prior to metal deposition. The etching can be performed by either wet (chemical) or dry (e.g., reactive ion etching) techniques.

Thus, there is provided by the present invention a DIC-RW laser diode that employs a single depressed-index cladding layer so as to obtain a large reduction in the transverse far-field beam divergence. By virtue of the usage of a single depressed-index cladding layer in the structure, it becomes possible to obtain nearly circular output beams, without the concomitant loss of laser diode performance or manufacturability, as associated with the prior art. The ability to obtain circular output beams is highly desirable since it significantly reduces the cost of optical recording systems and it lowers the coupling loss of the output beam into optical fibers.

EXAMPLE

Figure 3:
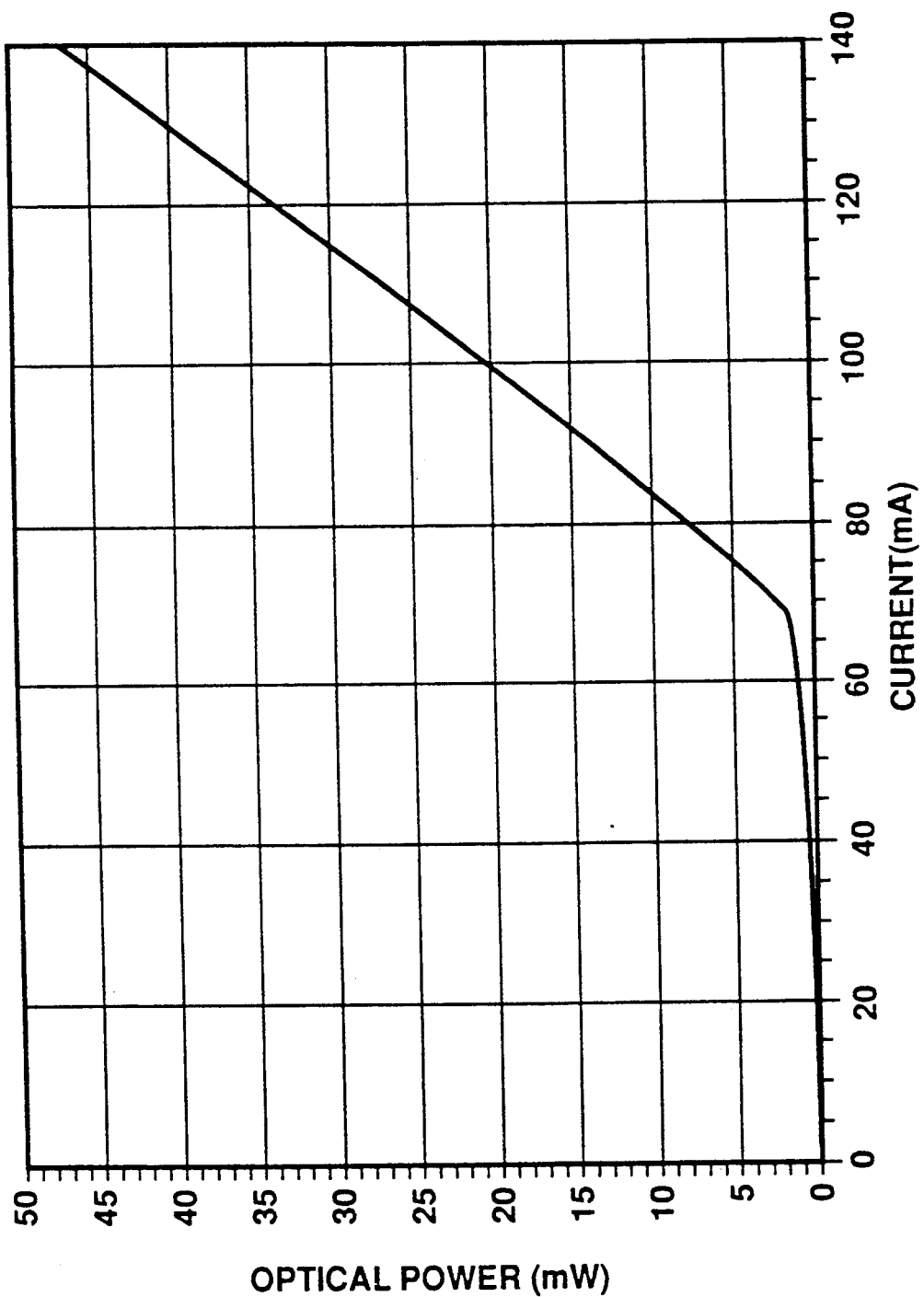
FIG. 3 is a representative graph of optical power versus current for the device of FIG. 2.
Figure 4:
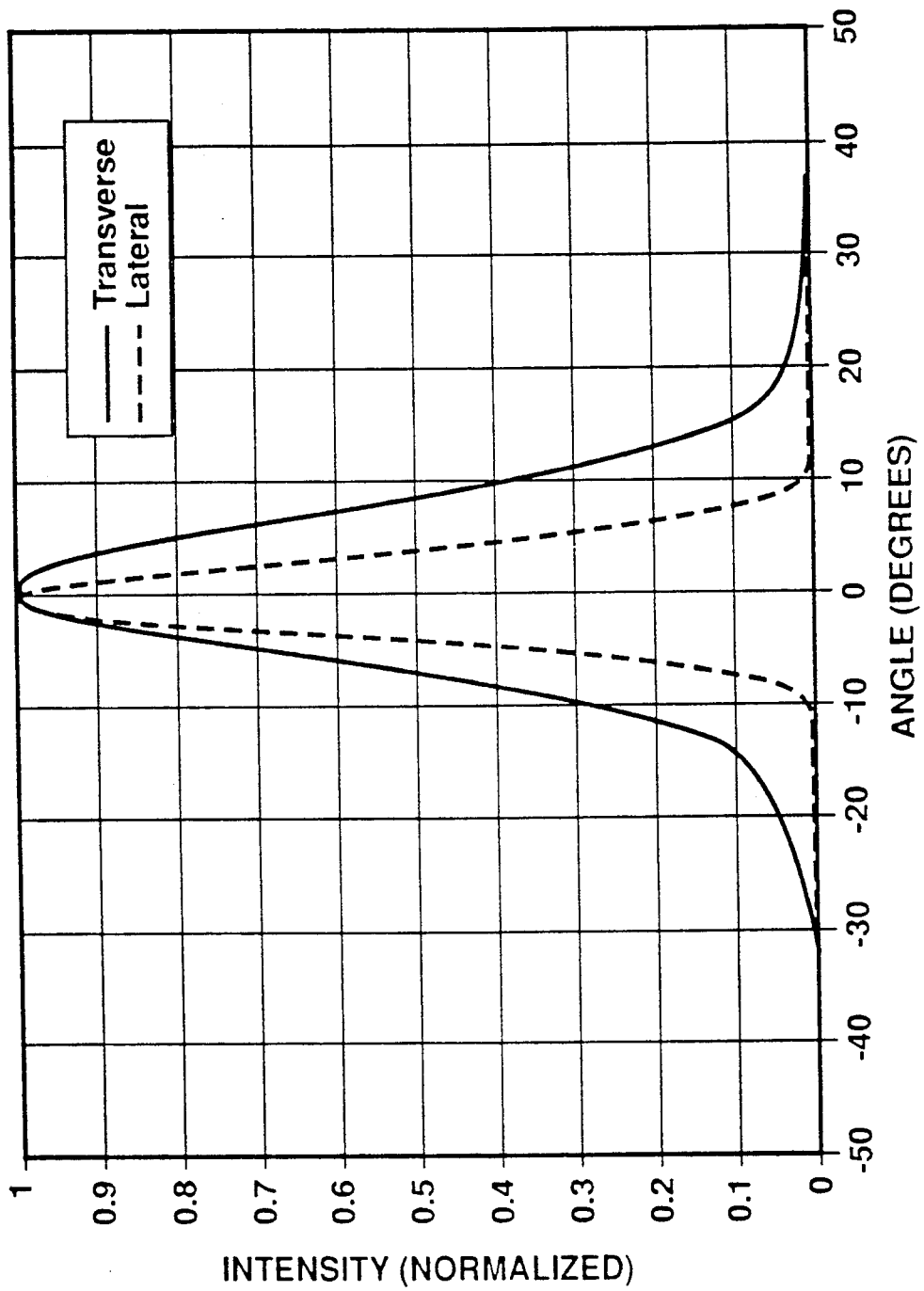
FIG. 4 is a representative graph of intensity versus angle ($\theta$) of the device of FIG. 2.

A depressed-index cladding ridge waveguide semiconductor laser diode was fabricated, whose layer structure is identical with that of the preferred embodiment. As practiced in the art, the rib structure was defined by standard photolithography techniques and etched using the acidic solution [H$_2$SO$_4$]$_{15}$:[H$_2$O$_2$]$_1$:[H$_2$O]$_1$ for 2.75 minutes at 6° C. The resulting rib sidewalls were inclined at 35° with respect to vertical. In reference to FIG. 2, the capping layer was etched to a width of 4.0 μm, while the etch terminated 0.45 μm from the top of the active layer. After the rib processing Si$_3$N$_4$ was uniformly deposited on the top of the device, followed by ohmic metal pattering on the top (Ti-Pt-Au) and uniform deposition on the backside (Pd-AuGe-Ag-Au) of the device, as practiced in the art. The patterning resulted in electrically isolating individual laser diodes. Next, using standard cleaving techniques, 500 μm long laser bars were formed, resulting in each laser diode being terminated by a pair of end-facet mirrors. As practiced in the art, the electrically isolated laser diodes were then physically separated by cleaving and mounted on Si submounts using Au-Sn solder. Finally, the entire assembly was mounted on a diamond heat sink, following conventional techniques. The heat-sinked laser diodes were CW-tested, resulting in the data given in FIGS. 3 and 4. In FIG. 3, the CW output power is plotted as a function of current through the laser diode. As desired the L-I curve is linear above threshold, remaining single-mode to at least 20 mW. In addition, the threshold current is 67 mA and the differential quantum efficiency is 44%. In FIG. 4, the far-field intensity distribution at 10 mW of output power is plotted as a function of angle for the components perpendicular (transverse) and parallel lateral) to the laser junction, solid and dashed lines, respectively. The full-width at half-maximums for the distributions are 16.4° and 8.2° for the transverse ($\theta_t$) and lateral ($\theta_l$) components, respectively, resulting in a far-field divergence ratio of 2.0. The theoretical beam divergence results are 17.40°, 7.50°, and 2.3 for $\theta_t$, $\theta_l$, and $\rho$, respectively, in very good agreement with the experimental data. Finally, for comparison, a similarly processed ridge waveguide laser diode without the depressed-index cladding and buffer layers would exhibit beam divergences of 22.2° and 6.3° for $\theta_t$ and $\theta_l$, respectively, resulting in $\rho$ of 3.5.

Advantages

The usage of a single depressed-index cladding layer enables one to obtain a significant lowering of the far-field divergence ratio with only a minimal change in the structure of typical ridge waveguide laser diodes. In addition, this structure is simple to manufacture and has smaller absorption losses than analogous structures employed in the prior art.

The invention has been described in detail with particular reference to certain preferred embodiments thereof, but it will be understood that variations and modifications can be effected within the spirit and scope of the invention.

What is claimed is
1. A depressed-index cladding ridge waveguide semiconductor laser diode comprising:
(a) a semiconductor substrate of a first conductivity type;
(b) a lower cladding layer of such first conductivity type deposited on the semiconductor substrate;
(c) a depressed-index cladding layer of such first conductivity formed on the lower cladding layer;
(d) a spacer layer of such first conductivity type deposited on the depressed-index cladding layer;
(e) a semiconductor active layer formed on the spacer layer;
(f) an upper cladding layer of a second conductivity type deposited on the semiconductor active layer;
(g) a capping layer of such second conductivity type formed on the upper cladding layer;
(h) a rib structure etched into the capping and upper cladding layers so as to provide lateral guiding; and
(i) electrically conductive layers formed on the substrate and capping layers.

2. The depressed-index cladding ridge waveguide semiconductor laser diode of claim 1 in which the conductivity of the substrate is either n- or p-type.

3. The depressed-index cladding ridge waveguide semiconductor laser diode of claim 1 in which the capping layer is n-type and zinc is diffused into the capping and upper cladding layers.

4. The depressed-index cladding ridge waveguide semiconductor laser diode of claim 1 in which the semiconductor material system is AlGaAs.

5. The depressed-index cladding ridge waveguide semiconductor laser diode of claim 4 in which the semiconductor active layer is composed of InGaAs.

6. The depressed-index cladding ridge waveguide semiconductor laser diode of claim 1 in which a depressed-index buffer layer is inserted between the semiconductor substrate and lower cladding layer.

7. The depressed-index cladding ridge waveguide semiconductor laser diode of claim 1 in which the semiconductor active layer is composed of multiple-quantum wells.

* * * * *